(12) United States Patent
Koyano et al.

(10) Patent No.: US 11,085,712 B2
(45) Date of Patent: Aug. 10, 2021

(54) HEAT-DISSIPATING SHEET

(71) Applicants: SEKISUI POLYMATECH CO., LTD., Saitama (JP); Panasonic Intellectual Property Management Co., Ltd., Osaka (JP)

(72) Inventors: Shigeru Koyano, Saitama (JP); Yoshifumi Iimuro, Hokkaido (JP); Yoshiya Sakaguchi, Kyoto (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 86 days.

(21) Appl. No.: 16/481,502

(22) PCT Filed: Jan. 19, 2018

(86) PCT No.: PCT/JP2018/001604
§ 371 (c)(1),
(2) Date: Jul. 29, 2019

(87) PCT Pub. No.: WO2018/139364
PCT Pub. Date: Feb. 8, 2018

(65) Prior Publication Data
US 2019/0390926 A1    Dec. 26, 2019

(30) Foreign Application Priority Data
Jan. 30, 2017   (JP) .............................. JP2017-014789

(51) Int. Cl.
*F28F 21/02*   (2006.01)
*F28F 21/06*   (2006.01)
(Continued)

(52) U.S. Cl.
CPC ............ *F28F 21/02* (2013.01); *F28F 21/067* (2013.01); *H01L 23/295* (2013.01);
(Continued)

(58) Field of Classification Search
CPC ...... F28F 21/02; F28F 21/067; F28F 2255/02; F28F 2255/06; H01L 23/295
See application file for complete search history.

(56) References Cited

U.S. PATENT DOCUMENTS 6,131,651 A * 10/2000 Richey, III .............. F28F 13/00
165/185
6,506,828 B1 * 1/2003 Anabuki ............... H01L 23/293
524/433
(Continued)

FOREIGN PATENT DOCUMENTS

JP   2003158393 A   5/2003
JP   2004090516 A   3/2004
(Continued)

OTHER PUBLICATIONS

International Search Report (PCT/ISA/210) dated Apr. 3, 2018, by the Japan Patent Office as the International Searching Authority for International Application No. PCT/JP2018/001604.
(Continued)

*Primary Examiner* — Devon Russell
(74) *Attorney, Agent, or Firm* — Buchanan, Ingersoll & Rooney PC

(57) ABSTRACT

To provide a heat-dissipating sheet having good close-contact properties with an adherend such as a heat-generating body and being easy to handle. A heat-dissipating sheet includes a heat-dissipating member including a graphite sheet, a first thermally conductive layer, and a second thermally conductive layer stacked in this order. The first thermally conductive layer contains a thermally conductive filler dispersed in a polymer matrix and has an outer shape larger than the graphite sheet when viewed in plan. The second thermally conductive layer contains a thermally conductive filler dispersed in a polymer matrix, is more flexible than the first thermally conductive layer, and has an
(Continued)

outer shape identical to or smaller than the first thermally conductive layer when viewed in plan.

12 Claims, 11 Drawing Sheets

(51) Int. Cl.
    *H01L 23/29*      (2006.01)
    *H05K 7/20*      (2006.01)

(52) U.S. Cl.
    CPC ...... *H05K 7/20454* (2013.01); *F28F 2255/02* (2013.01); *F28F 2255/06* (2013.01); *F28F 2275/08* (2013.01); *H05K 7/2049* (2013.01)

(56) References Cited

U.S. PATENT DOCUMENTS

| | | | |
|---|---|---|---|
| 2003/0096116 A1 | 5/2003 | Mita et al. | |
| 2004/0043229 A1* | 3/2004 | Aoki | B32B 25/02 428/446 |
| 2012/0152510 A1* | 6/2012 | Noda | H01L 23/34 165/185 |
| 2016/0159037 A1 | 6/2016 | Sakaguchi et al. | |
| 2016/0209133 A1* | 7/2016 | Hu | B32B 37/142 |
| 2017/0251571 A1 | 8/2017 | Chien | |
| 2017/0309543 A1* | 10/2017 | Aoki | H01L 23/3737 |

FOREIGN PATENT DOCUMENTS

| | | |
|---|---|---|
| JP | 2006093546 A | 4/2006 |
| JP | 2007266518 A | 10/2007 |
| JP | 2010070413 A | 4/2010 |
| JP | 2013102180 A | 5/2013 |
| JP | 2014061662 A | 4/2014 |
| JP | 2014187233 A | 10/2014 |
| JP | 2016063201 A | 4/2016 |
| JP | 2016082155 A | 5/2016 |
| JP | 3208275 U | 12/2016 |
| JP | 2017014399 A | 1/2017 |
| WO | 2016104074 A1 | 6/2016 |

OTHER PUBLICATIONS

Written Opinion (PCT/ISA/237) dated Apr. 3, 2018, by the Japan Patent Office as the International Searching Authority for International Application No. PCT/JP2018/001604.

* cited by examiner

Fig.4
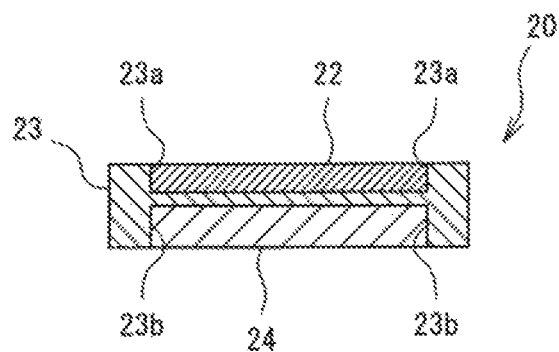
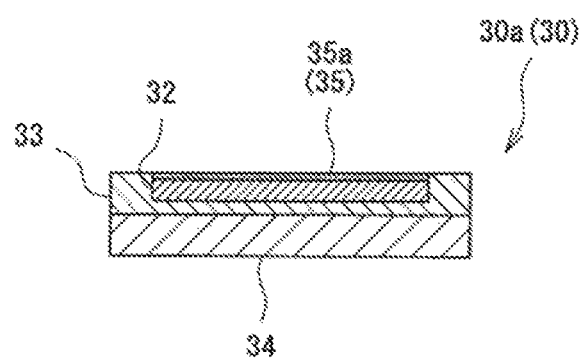
Fig.5A
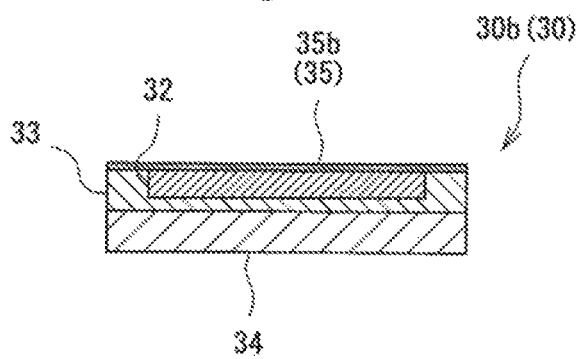
Fig.5B heat-dissipating sheet

HEAT-DISSIPATING SHEET

TECHNICAL FIELD

The present invention relates to a heat-dissipating sheet that is disposed between a heat-generating body and a heat-dissipating body when used.

BACKGROUND ART

High-performance semiconductor devices and machine parts are used in electronic apparatuses such as computers and automobile components. Local heat generation by these devices and so forth is called a heat spot. If the heat generation is not dealt with, it may cause damage to the devices and so forth. To eliminate the heat spot, heat generated from devices and so forth is effectively dissipated with metal sheets or graphite sheets having very high thermal conductivity in planar directions.

However, metal sheets and graphite sheets have relatively hard surfaces and thus do not come into close contact with heat-generating bodies such as semiconductor devices. Heat generated from heat-generating bodies is not always efficiently dissipated. To solve the problems, a method has been reported in which a flexible thermally conductive material is disposed between a graphite sheet and a heat-generating body.

For example, Japanese Unexamined Patent Application Publication No. 2013-102180 (Patent Literature 1) describes a technique about a heat-dissipating member in which a thermally conductive rubber sheet is stacked on a graphite sheet. Japanese Unexamined Patent Application Publication No. 2003-158393 (Patent Literature 2) describes a technique about a heat-dissipating member in which a phase change sheet is stacked on a graphite sheet. Japanese Unexamined Patent Application Publication No. 2007-266518 (Patent Literature 3) describes a technique about a heat-dissipating member in which thermally conductive grease is applied to a graphite sheet.

CITATION LIST

Patent Literature

PTL 1: Japanese Unexamined Patent Application Publication No. 2013-102180
PTL 2: Japanese Unexamined Patent Application Publication No. 2003-158393
PTL 3: Japanese Unexamined Patent Application Publication No. 2007-266518

SUMMARY OF INVENTION

Technical Problem

However, in the case of using the technique in which the thermally conductive rubber sheet is stacked on the graphite sheet and which is described in Japanese Unexamined Patent Application Publication No. 2013-102180 (Patent Literature 1), even if a heat-dissipating member is mounted to a heat-generating body by pressure contact in such a manner that a state as illustrated in FIG. 14(a) is obtained, the shape is recovered owing to the rubber elasticity of the thermally conductive sheet when the pressure is released, thereby leading to a state as illustrated in FIG. 14(b). This may impair the state of close contact between the thermally conductive rubber sheet and recessed portions and side surfaces of the heat-generating body to form a void.

Lowering the hardness of the thermally conductive rubber sheet can improve close-contact properties. However, when the hardness of the thermally conductive rubber sheet is lowered, the thermally conductive rubber sheet may be deformed during handling. Thus, the thermally conductive rubber sheet can fail to be appropriately attached to the heat-generating body on an electronic substrate.

Additionally, the thermally conductive rubber sheet may have an uneven thickness to form a portion that does not come into close contact with the heat-generating body.

In the technique in which the phase change sheet is stacked and which is described in Japanese Unexamined Patent Application Publication No. 2003-158393 (Patent Literature 2), the phase change sheet has a relatively low thermal conductivity and changes to a liquid phase by heat to become thin. Thus, in the case where the technique is used for a heat-generating body having relatively large irregularities, the phase change sheet is thin and reduced in thermal resistance at protruding portions. At other portions, however, the phase change sheet is not thin. Additionally, because the phase change sheet is in the liquid phase when heated, the phase change sheet flows at recessed portions where the phase change sheet becomes thick. It is difficult to control the expansion of the phase change sheet, and thus the phase change sheet may protrude from a predetermined range.

In the technique described in Japanese Unexamined Patent Application Publication No. 2007-266518 (Patent Literature 3), the thermally conductive grease does not have impact resilience and is not recovered when used. The state of close contact between the thermally conductive rubber sheet and the recessed portions and the side surfaces of the heat-generating body is not impaired. However, in the case where the technique is used for a heat-generating body having relatively large irregularities, it is difficult to control the expansion of the thermally conductive grease during pressure contact, and thus the thermally conductive grease may protrude from a predetermined range. When problems such as the protrusion and adhesion to an unintended portion occur, it is difficult to remove the thermally conductive grease, and thus the workability is disadvantageously poor during production.

The present invention has been made in light of the foregoing problems. It is an object of the present invention to provide a heat-dissipating sheet having good close-contact properties with an adherend such as a heat-generating body or an electronic substrate and is easy to handle.

Solution to Problem

A heat-dissipating sheet according to the present invention for achieving the foregoing object is configured as described below.

The heat-dissipating sheet includes a heat-dissipating member including a graphite sheet, a first thermally conductive layer, and a second thermally conductive layer stacked in this order. The first thermally conductive layer contains a thermally conductive filler dispersed in a polymer matrix and has an outer shape larger than the graphite sheet when viewed in plan. The second thermally conductive layer contains a thermally conductive filler dispersed in a polymer matrix, is more flexible than the first thermally conductive layer, and has an outer shape identical to or smaller than the first thermally conductive layer when viewed in plan.

According to the present invention, the heat-dissipating member includes the graphite sheet, the first thermally conductive layer, and the second thermally conductive layer stacked in this order and thus has good thermal conductivity owing to the use of the graphite sheet. The thermally conductive layer can efficiently transfer heat generated from a heat-generating body to the graphite sheet. In the present invention, the thermally conductive layer is a stack of the first thermally conductive layer and the second thermally conductive layer. This enables these thermally conductive layers to have different characteristics.

The first thermally conductive layer contains the thermally conductive filler dispersed in the polymer matrix and has an outer shape larger than the graphite sheet when viewed in plan. Thus, the first thermally conductive layer can prevent the detachment of a graphite powder from an end portion of the graphite sheet, has thermal conductivity, and can protect the outer shape of the graphite sheet. The term "when viewed in plan" refers to viewing the heat-dissipating sheet in the thickness direction from a surface adjacent to (including) the graphite sheet exposed. For the convenience of description, the graphite sheet side also referred to as an "upper surface", and the second thermally conductive layer side is also referred to as a "lower surface". However, the use form of the heat-dissipating sheet is not limited thereto.

Each of the first thermally conductive layer and the second thermally conductive layer contains the thermally conductive filler dispersed in the polymer matrix and thus has good thermal conductivity. The second thermally conductive layer is more flexible than the first thermally conductive layer and has an outer shape identical to or smaller than the first thermally conductive layer when viewed in plan; thus, the second thermally conductive layer can increase the degree of close contact with a heat-generating body. The first thermally conductive layer can be configured to have shape-retaining properties and the function of improving the handleability so as not to be easily deformed. In a process for manufacturing the heat-dissipating sheet and in the operation of mounting the heat-dissipating sheet to the heat-generating body, the first thermally conductive layer that improves the handleability can suppress the deformation of the graphite sheet and the thermally conductive layer and the delamination between the graphite sheet and the thermally conductive layer.

The first thermally conductive layer can be configured to have the same outer shape as the graphite sheet when viewed in plan. According to the present invention, the graphite sheet, the first thermally conductive layer, and the second thermally conductive layer may all be configured to have the same outer shape. For this reason, according to the present invention, a large heat-dissipating sheet can be cut to form small heat-dissipating sheets having a freely-selected shape. Thus, the heat-dissipating sheet can be easily produced at low cost.

The first thermally conductive layer can be configured to have an outer shape larger than the graphite sheet when viewed in plan. According to the present invention, the first thermally conductive layer can prevent the detachment of the graphite powder from an end portion of the graphite sheet, has thermal conductivity, and can protect the outer shape of the graphite sheet. The term "when viewed in plan" refers to viewing the heat-dissipating sheet in the thickness direction from a surface adjacent to (including) the graphite sheet exposed. For the convenience of description, the graphite sheet side also referred to as an "upper surface", and the second thermally conductive layer side is also referred to as a "lower surface". However, the use form of the heat-dissipating sheet is not limited thereto.

The heat-dissipating sheet according to the present invention can be configured to include the first thermally conductive layer having a type OO hardness of more than 30 and the second thermally conductive layer having a type OO hardness of 30 or less. According to the present invention, because the first thermally conductive layer has a type OO hardness of more than 30, the heat-dissipating sheet has the shape-retaining properties and improved handleability. Because the second thermally conductive layer has a type OO hardness of 30 or less, the second thermally conductive layer can conform to the irregularities even at a low pressure load and can be brought into close contact with an electronic substrate including various electronic elements such as ICs serving as heat-generating bodies and having irregularities.

The second thermally conductive layer can be configured in such a manner that the second thermally conductive layer has a polymer matrix content of 50% or less by mass and the polymer matrix alone has a type OO hardness of 3 or less. In the present invention, the second thermally conductive layer has a polymer matrix content of 50% or less by mass, and the polymer matrix alone, excluding the thermally conductive filler, has a type OO hardness of 3 or less. This can reduce the rubber elasticity of the polymer matrix and can provide the second thermally conductive layer that is flexible but has low resilience.

The first thermally conductive layer can be configured to include an outer portion that protrudes from the outer shape of the graphite sheet and an inner portion that does not protrude from the outer shape of the graphite sheet when viewed in plan, the outer portion being thicker than the inner portion. In the present invention, the first thermally conductive layer includes the outer portion that protrudes from the outer shape of the graphite sheet and the inner portion that does not protrude from the outer shape of the graphite sheet when viewed in plan, the outer portion being thicker than the inner portion; thus, the shape-retaining properties of the outer edge of the heat-dissipating sheet can be improved. Accordingly, when the heat-dissipating sheet is peeled from a release film, the deformation of the heat-dissipating sheet can be easily suppressed to improve the handleability of the heat-dissipating sheet. A portion (the inner portion) of the first thermally conductive layer in contact with the graphite sheet in the vertical direction has a smaller thickness. Thus, assuming that the heat-dissipating sheet has a predetermined thickness, the second thermally conductive layer can have a relatively large thickness. This results in increased conformability to the irregularities of the heat-generating body.

The second thermally conductive layer can be configured to have lower resilience than the first thermally conductive layer. The second thermally conductive layer has lower resilience than the first thermally conductive layer and thus can improve the state of close contact with an electronic substrate including various electronic elements such as ICs serving as heat-generating bodies and having irregularities.

The heat-dissipating sheet can be configured to have a protective layer disposed on a surface of the heat-dissipating sheet adjacent to the graphite sheet, the protective layer covering the graphite sheet. According to the present invention, the protective layer covering the surface adjacent to the graphite sheet is provided and can protect the graphite sheet. For example, the durability of the heat-dissipating sheet is improved, and the detachment of the graphite powder from the surface is prevented.

The heat-dissipating sheet can be configured to include a release layer disposed on at least one of a surface of the heat-dissipating sheet adjacent to the graphite sheet and a surface opposite to the surface. The release layer is disposed on at least one of the surface of the heat-dissipating sheet adjacent to the graphite sheet and the surface opposite to the surface. The release layer covers the surface of the heat-dissipating member and the surface opposite to the surface, thereby protecting the heat-dissipating member from the adhesion of dust, dirt, and so forth. When the heat-dissipating sheet is mounted on an electronic substrate, the release layer can be easily peeled from the heat-dissipating member and has good handleability.

The first thermally conductive layer can be configured to have a higher thermal conductivity than the second thermally conductive layer. That is, the first thermally conductive layer is hard and has a high thermal conductivity, compared with the second thermally conductive layer. Thus, the first thermally conductive layer can contain a large amount of the thermally conductive filler. Accordingly, in addition to the thermal conductivity, the strength can be improved by the reinforcing effect of the thermally conductive filler, and the handleability can be further improved. The first thermally conductive layer, which is farther from the heat-generating body than the second thermally conductive layer, has a high thermal conductivity; thus, heat can be efficiently dissipated.

The second thermally conductive layer can be configured to have a higher thermal conductivity than the first thermally conductive layer. In the heat-dissipating sheet, because the second thermally conductive layer is deformed in accordance with the shape of the heat-generating body, the second thermally conductive layer has a relatively large thickness, in some cases. In the case of the second thermally conductive layer having a large thickness, an increase in the thermal conductivity of the second thermally conductive layer is effective in increasing the heat dissipation properties of the heat-dissipating sheet. In the case where the amount of the thermally conductive filler contained in the first thermally conductive layer is smaller than that in the second thermally conductive layer, the first thermally conductive layer can be strong despite a thin film.

The graphite sheet can be configured to be a laminated graphite sheet in which both front and back surfaces of sheet-shaped graphite are laminated with protective films. Because the graphite sheet is the laminated graphite sheet in which both front and back surfaces of the sheet-shaped graphite are laminated with the protective films, it is possible to prevent the detachment of a graphite powder.

Advantageous Effects of Invention

The heat-dissipating sheet according to the present invention is easy to handle and has good close-contact properties with an adherend such as an electronic substrate on which an electronic device is mounted and which thus has an irregular surface.

BRIEF DESCRIPTION OF DRAWINGS

FIG. 1(a) is a plan view thereof, and FIG. 1(b) is a cross-sectional view taken along line Ib-Ib of FIG. 1(a).

FIG. 2(a) is an explanatory drawing of a state in which release films are attached, FIG. 2(b) is an explanatory drawing of a state in which one of the release films is removed, and FIG. 2(c) is an explanatory drawing of a state in which the other release film is removed.

FIG. 3(a) is an explanatory drawing of the position of the heat-dissipating sheet to be mounted on an electronic substrate, and FIG. 3(b) is an explanatory drawing of a state in which the heat-dissipating sheet is pressed into contact with the electronic substrate.

FIG. 4 is a cross-sectional view of a heat-dissipating sheet according to a second embodiment, the view corresponding to FIG. 1(b).

FIGS. 5a and 5b is a cross-sectional view of a heat-dissipating sheet according to a third embodiment, the view corresponding to FIG. 1(b), FIG. 5(a) illustrates a heat-dissipating sheet having a structure in which a protective layer covers a graphite sheet, and FIG. 5(b) illustrates a heat-dissipating sheet having a structure in which a protective layer covers the entirety of a surface.

FIG. 6(a) illustrates a heat-dissipating sheet having a structure in which a first thermally conductive layer is exposed outside a protective layer, and FIG. 6(b) illustrates a heat-dissipating sheet having a structure in which a protective layer covers the first thermally conductive layer.

FIG. 7(a) illustrates a heat-dissipating sheet having a structure in which release layers cover both front and back surfaces, FIG. 7(b) illustrates a heat-dissipating sheet having a structure in which a release layer covers a surface of the heat-dissipating sheet adjacent to a second thermally conductive layer, and FIG. 7(c) illustrates a heat-dissipating sheet having a structure in which a release layer covers a surface of the heat-dissipating sheet adjacent to a graphite sheet.

FIG. 13(a) is a plan view illustrating the position of the heat-dissipating sheet covering a heat-dissipating body, and FIG. 13(b) is a front elevational view.

FIG. 14(a) is an explanatory drawing illustrating a state immediately after the heat-dissipating sheet is pressed into contact with an electronic substrate, and FIG. 14(b) is an explanatory drawing illustrating a state when the pressure is released.

FIG. 15(a) is an explanatory drawing illustrating a state in which a release film is peeled, and FIG. 15(b) is an explanatory drawing illustrating a state in which the outer edge of the thermally conductive layer protrudes.

DESCRIPTION OF EMBODIMENTS

The present invention will be described in more detail based on embodiments. In each of the embodiments, redundant descriptions of the same material, composition, production method, effect, and so forth are omitted.

Figure 1A:
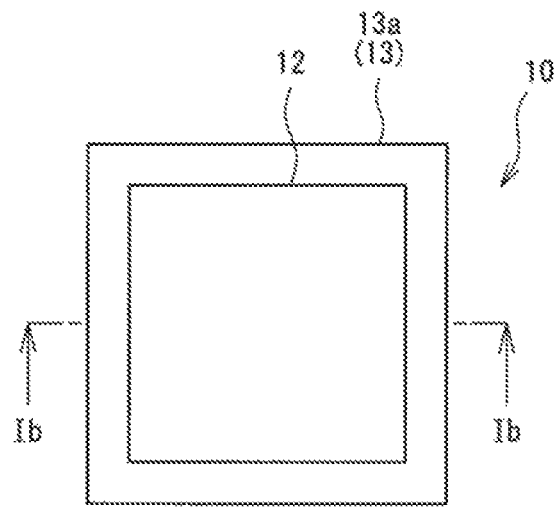
FIGS. 1a and 1b illustrates a heat-dissipating sheet according to a first embodiment.
Figure 1B:
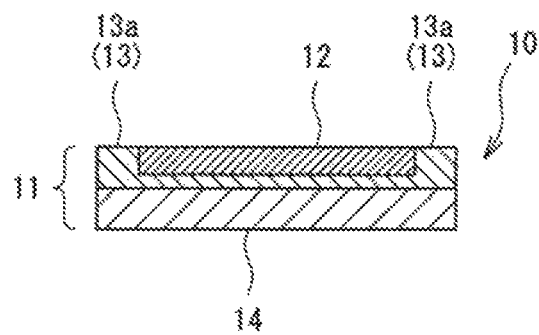

First Embodiment [FIGS. 1a and 1b]

<Shape and Material of Heat-Dissipating Sheet>

FIGS. 1a and 1b illustrates a heat-dissipating sheet 10 according to this embodiment. As illustrated in FIG. 1(b), the heat-dissipating sheet 10 includes a heat-dissipating member 11 including a graphite sheet 12, a first thermally conductive layer 13, and a second thermally conductive layer 14 stacked in this order. As illustrated in FIG. 1(a), the outer shape is a rectangular shape (quadrilateral) here. The first thermally conductive layer 13 is larger than the graphite sheet 12. The end portion of the graphite sheet 12 is surrounded by the thick portion 13a of the first thermally conductive layer 13. The outer shape of the heat-dissipating sheet is not limited to the rectangular shape, and any shape may be used. For example, another polygon, a circle, or a shape having a hole arranged to avoid a predetermined portion may be used.

In the graphite sheet 12, crystal faces extend in the planar directions, and a very high isotropic thermal conductivity is provided in their faces. Thus, the thermal conductivity in a specific direction can be increased by aligning the directions of the faces in a predetermined direction.

As the graphite sheet 12, a sheet produced from natural graphite or artificial graphite or an artificial graphite sheet produced by the pyrolysis of a polymer film (hereinafter, referred to as a "film pyrolysis sheet") may be used. The film pyrolysis sheet has high thermal conductivity particularly in the planar direction of the sheet and thus is preferred.

The film pyrolysis sheet can be obtained by firing a polymer film at a high temperature of 2,400° C. to 3,000° C. in an inert gas. The firing may be performed in one step or two or more steps. The inert gas is preferably nitrogen or argon.

As the polymer film to be graphitized, an aromatic polymer such as polyimide is preferably used. This is because a graphite film having a developed graphite structure and having a high thermal conductivity can be obtained. The polymer film preferably has a thickness of 400 μm or less, more preferably 10 to 200 μm.

The graphite sheet 12 preferably has a thickness of 10 to 100 μm, more preferably 30 to 100 μm. A thickness of less than 10 μm may result in the degradation of the heat dissipation characteristics. If a graphite sheet having a thickness of more than 100 μm is used, the improvement of the heat dissipation characteristics is low and is not commensurate with the increase in thickness. The problem of raising cost may be caused by an increase in the amount of material used. A thickness of less than 30 μm results in a slight decrease in the strength of the graphite sheet. To enhance the degree of protection, a structure in combination with a protective layer is preferably used. A thickness of 30 μm or more is preferred in terms of the strength of the graphite sheet.

The first thermally conductive layer 13 contains a thermally conductive filler dispersed in a polymer matrix and has flexibility and shape-retaining properties. The first thermally conductive layer 13 defines the outer shape of the heat-dissipating member 11. The first thermally conductive layer 13 has an outer shape larger than the graphite sheet 12 and also serves to protect the graphite sheet 12.

The first thermally conductive layer 13 is not particularly limited in terms of thickness and is preferably a thin film to the extent that the shape thereof is maintained at the peripheral portion of the heat-dissipating sheet 10. The peripheral portion of the heat-dissipating sheet 10, in particular, the outer portion of the first thermally conductive layer 13 protruding from the outer shape of the graphite sheet 12 has shape-retaining properties. This can effectively improve the handleability of the heat-dissipating sheet 10 as described below. For example, the thickness of the first thermally conductive layer 13 is 300 μm or more at a type OO hardness of 31, preferably 200 μm or more at a type OO hardness of 40, and may be 100 μm or more at a type A hardness of 50. The first thermally conductive layer 13 preferably has a thickness of 500 μm or less because a thickness of more than 500 results in substantially no improvement in shape-retaining property and possibly result in an increase in thermal resistance.

Preferably, the polymer matrix is a polymer such as a resin or rubber and is formed by curing a liquid polymer composition composed of a mixed system containing a main component and a curing agent. For example, the liquid polymer composition may contain an uncrosslinked rubber and a crosslinking agent or may contain a crosslinking agent-containing uncrosslinked rubber and a crosslinking promoter. The curing reaction may be a room-temperature curing or thermal curing. In the case where the polymer matrix is a silicone rubber, the composition contains, for example, an alkenyl group-containing organopolysiloxane and an organohydrogenpolysiloxane. In the case where the polymer matrix is a polyester-based thermoplastic elastomer, the composition may contain a diol and a dicarboxylic acid. In the case where the polymer matrix is a polyurethane-based thermoplastic elastomer, the composition may contain a diisocyanate and a diol. Among these polymer compositions (uncured polymer matrices), an addition-reaction-type silicone rubber is preferably used because it has a wide adjustable range of hardness of the polymer matrix after curing and good filling properties of the thermally conductive filler. In the case of the silicone rubber, it can also be used as a polymer matrix of the second thermally conductive layer 14 having flexible and low resilience.

The thermally conductive filler is a material that imparts thermal conductivity to the polymer matrix. A powdery material having a high thermal conductivity can be used.

Examples of the thermally conductive filler include powders of metals, metal oxides, metal nitrides, metal carbides, metal hydroxides, and graphite. Examples of the metals include aluminum, copper, and nickel. Examples of the metal oxides include aluminum oxide, magnesium oxide, zinc oxide, and quartz. Examples of the metal nitrides include boron nitride and aluminum nitride. An example of the metal carbides is silicon carbide. An example of the metal hydroxides is aluminum hydroxide. Examples of the graphite include spherical graphite, scaly graphite, and graphitized carbon fibers. Among these thermally conductive fillers, aluminum oxide and aluminum are preferred because they have a high thermal conductivity and are easily available in spherical form. Aluminum hydroxide is preferred because it is easily available and can improve the flame retardancy of the heat-dissipating sheet. The graphite powder is particularly preferred because it has a very high thermal conductivity in the direction of the crystal face of graphite and thus the thermal conductivity of the thermally conductive layer can be improved by aligning the crystal faces in a given direction.

The shape of the thermally conductive filler is not particularly limited and preferably has a low aspect ratio. In particular, the thermally conductive filler having an aspect ratio of 2 or less can suppress an increase in the viscosity of a composition mixed with an uncured liquid polymer matrix and thus is easily densely filled. For these reasons, the thermally conductive filler preferably has a spherical shape.

Regarding a high-aspect-ratio graphite powder having a scaly or fibrous shape, in the case of the scaly shape, graphite crystals extend in the scale surface in the direction of the long axis. In the case of the fibrous shape, graphite crystals extend in the direction of the fiber axis. By aligning the particles of the graphite powder in a predetermined direction, the crystal directions of particles of graphite can be aligned to improve the thermal conductivity in the predetermined direction.

The thermally conductive filler preferably has an average particle size of 0.5 to 100 μm. An average particle size of more than 100 μm may result in a difficulty in producing the first thermally conductive layer 13 of the thin film. The thermally conductive filler having an average particle size of less than 0.5 μm has a large specific surface area; thus, the viscosity is liable to increase to make it difficult to densely charge the thermally conductive filler. However, when the chargeability is not adversely affected, the thermally conductive filler having an average particle size less than 0.5 μm may be contained. The average particle size of the thermally conductive filler can be expressed as the volume-average particle size in a particle size distribution measured by a laser diffraction/scattering method (JIS R1629).

The thermally conductive filler is preferably contained in an amount of 300 to 2,000 parts by mass, more preferably 300 to 1,700 parts by mass per 100 parts by mass of the polymer matrix. When the thermally conductive filler content is less than 300 parts by mass per 100 parts by mass of the polymer matrix, the thermal conductivity may decrease. A higher thermally conductive filler content can result in a higher thermal conductivity. However, a thermally conductive filler content of more than 2,000 parts by mass may result in excessively high viscosity to cause a difficulty in producing the thermally conductive layer having a thin-film shape.

The first thermally conductive layer 13 preferably has a type OO hardness, specified by ASTM D2240, of more than 30. When the first thermally conductive layer 13 has a type OO hardness of more than 30, desired shape-retaining properties can be provided, thereby improving the handleability of the heat-dissipating sheet 10. The first thermally conductive layer 13 more preferably has a type OO hardness of 40 or more because even if the first thermally conductive layer 13 has a relatively small thickness, the first thermally conductive layer 13 can have sufficient shape-retaining properties. The upper limit of the hardness is not particularly set. To provide a certain degree of flexibility, the type A hardness, specified by ASTM D2240, is preferably 80 or less. At a type A hardness of more than 80, the heat-dissipating sheet 10 may be brittle and easily damaged.

The first thermally conductive layer 13 having the foregoing characteristics has the thick portion 13a at its outer portion protruding from the outer shape of the graphite sheet 12 when viewed in plan. The thick portion 13a is thicker than the inner portion of the first thermally conductive layer 13 that does not protrude from the outer shape of the graphite sheet 12. The first thermally conductive layer 13 has the thick portion 13a as described above and thus can improve the shape-retaining properties of the periphery of the heat-dissipating sheet 10. Specifically, when the heat-dissipating sheet 10 is peeled from a release film, the deformation of the heat-dissipating sheet 10 due to elongation can be effectively inhibited. Thus, when the heat-dissipating sheet 10 is bonded to an adherend such as a heat-generating body or an electronic substrate, it is possible to inhibit deviation from an appropriate range or the occurrence of a portion that does not come into close contact with the heat-generating body due to uneven thickness. That is, the handleability of the heat-dissipating sheet 10 can be effectively improved.

A portion of the first thermally conductive layer 13 in contact with the graphite sheet 12 in the vertical direction has a smaller thickness. Thus, assuming that the heat-dissipating sheet 10 has a predetermined thickness, the second thermally conductive layer 14 can have a relatively large thickness. This results in increased conformability to the irregularities of the heat-generating body.

The second thermally conductive layer 14 contains the thermally conductive filler dispersed in the polymer matrix. The second thermally conductive layer 14 is more flexible than the first thermally conductive layer 13 and has the same outer shape as the first thermally conductive layer 13 when viewed in plan. The outer shape of the second thermally conductive layer 14 is larger than that of the graphite sheet 12.

The second thermally conductive layer 14 needs to have a thickness at least larger than the height of the irregularities of the heat-generating body, which is an adherend, and preferably has a thickness of 1.2 or more times the maximum height of the irregularities of the heat-generating body. The upper limit of the thickness is not particularly limited and is preferably 10 mm or less because the thermal resistance may be increased.

As the polymer matrix and the thermally conductive filler used for the second thermally conductive layer 14, the materials exemplified for the first thermally conductive layer 13 may be used. Among these, the polymer matrix is particularly composed of particularly flexible rubber. Specifically, an addition reaction-type silicone rubber whose type OO hardness is easily adjusted to 30 or less is preferably used.

The second thermally conductive layer 14 preferably has a type OO hardness of 30 or less. The second thermally conductive layer 14 having a type OO hardness of 30 or less can conform to the irregularities even at a low pressure load and can be brought into close contact with the heat-generating body having irregularities. The second thermally conductive layer 14 more preferably has a type OO hardness of 20 or less, even more preferably 5 or less. The lower limit of the type OO hardness is difficult to specify. A penetration number of 200 or less is preferred. At a penetration number of more than 200, fluidity occurs. Because the heat-dissipating sheet 10 may deviate from a predetermined range when bonded by pressure contact, the heat-dissipating sheet 10 may be difficult to handle. The penetration number is measured with an instrument specified by JIS K2207. Specifically, the penetration number refers to penetration depth when a needle having a predetermined shape makes an entry into a test piece at a total weight of the needle and a needle-fixing device (i.e., a load applied to a test piece) of 50 g for five seconds.

The second thermally conductive layer 14 preferably has lower resilience than the first thermally conductive layer 13. Typically, a rubber material with higher flexibility has a lower permanent compression set and thus tends to have high resilience. The second thermally conductive layer 14 more flexible than the first thermally conductive layer 13 seems to have higher resilience than the first thermally conductive layer 13. However, a material having more flexibility and lower resilience than the first thermally conductive layer 13 is used for the second thermally conductive layer 14 here.

The resilience was determined by pressing the heat-dissipating sheet 10 (or an evaluation material) into contact with an electronic substrate on which an IC is mounted, holding the pressure contact state for a while, and observing the state of close contact between the electronic substrate and the heat-dissipating sheet 10 (or the evaluation material) after a certain period of time after releasing the pressure (unloading). In other words, after the pressing, the resilience was evaluated by peeling width indicating how long the heat-dissipating sheet 10 (or the evaluation material) peeled from the position of the IC on the electronic substrate in the planar direction of the electronic substrate. If the peeling width is three or less times the height of the IC, the deformed state seems to be sufficiently maintained. In this case, the resilience is low, which is preferred. Most preferably, substantially no resilience is provided, and the peeling width is zero.

The reason it is flexible but has low resilience is not clear. To form a thermally conductive layer having low resilience, the second thermally conductive layer 14 preferably has a composition as follows: A polymer matrix in which a cured product containing no thermally conductive filler has a type OO hardness of about 3 or less and a penetration number of 150 or more is used, and the polymer matrix content is 50% or less by mass based on the total mass including the thermally conductive filler. This configuration can reduce the rubber elasticity of the polymer matrix and can provide the second thermally conductive layer 14 that is flexible but has low resilience. A type OO hardness of the polymer matrix of more than 3 may result in high rubber elasticity of the polymer matrix and high resilience even when a large amount of the thermally conductive filler is charged. An amount of the thermally conductive filler of less than 50% by mass may result in high rubber elasticity and high resilience of the second thermally conductive layer 14.

The second thermally conductive layer 14 preferably has an adhesive strength of 0.5 N/cm$^2$ or more, which is obtained from the result of an adhesion test by a test method described in examples below. When the second thermally conductive layer 14 has an adhesive strength of 0.5 N/cm$^2$ or more, the state of close contact with an adherend such as an electronic substrate is easily maintained even in a non-pressure contact state.

In the case where the thermally conductive filler is aligned in a thermally conductive layer, the thermally conductive filler is preferably aligned in the first thermally conductive layer 13. When the heat-dissipating sheet 10 is pressed into contact with a heat-generating body, because the deformation of the first thermally conductive layer 13 is small, the aligned state is easily maintained. However, because the second thermally conductive layer 14 is largely deformed to easily disturb the alignment. Thus, the alignment effect is difficult to provide.

The first thermally conductive layer 13 and the second thermally conductive layer 14 may contain various additives to the extent that the function as the heat-dissipating sheet 10 is not impaired. For example, organic components such as a plasticizer, a dispersant, a coupling agent, and a tackiness agent may be contained. As other components, for example, a flame retardant, an antioxidant, and a colorant may be appropriately added.

<Method for Producing Heat-Dissipating Sheet>

A method for producing the heat-dissipating sheet 10 will be described. A first thermally conductive layer composition (first thermally conductive layer coating liquid) for the formation of the first thermally conductive layer 13 and a second thermally conductive layer composition (second thermally conductive layer coating liquid) for the formation of the second thermally conductive layer 14 are prepared by dispersing a thermally conductive filler in a liquid polymer composition. The graphite sheet 12 cut into a predetermined shape in advance and a slightly tacky release film are provided in advance.

The cut graphite sheet 12 is bonded to the release film. The first thermally conductive layer composition is applied with a bar coater so as to have a uniform thickness and cover the graphite sheet 12, and then cured to form the first thermally conductive layer 13. The second thermally conductive layer composition is applied to a surface of the first thermally conductive layer 13 and cured to form the second thermally conductive layer 14. The first thermally conductive layer 13 and the second thermally conductive layer 14 are cut at a position offset outward from the outer edge of the graphite sheet 12 to produce the heat-dissipating sheet 10.

As a method for forming the first thermally conductive layer 13 and the second thermally conductive layer 14, a doctor blade method, an extrusion method (for example, a T-die method), a calender method, a press forming method, and a casting method are exemplified in addition to the bar coating method. Thus, the viscosity of each of the first thermally conductive layer composition and the second thermally conductive layer composition is preferably in a range in which a desired thin film can be formed in accordance with the formation method.

The production method described above is an example and is not limited thereto. For example, in the case where the first thermally conductive layer 13 and the second thermally conductive layer 14 have adhesion to such an extent that they can be bonded to each other, the first thermally conductive layer 13 and the second thermally conductive layer 14 separately formed can be bonded and integrated with each other. In the case where they are not tacky, they can be stacked with, for example, an adhesive. However, because an adhesive layer may be a factor in decreasing the heat resistance and thermal conductivity, it is preferable not to dispose the adhesive layer therebetween.

<Mounting Structure of Heat-Dissipating Sheet>

The heat-dissipating sheet 10 is produced while both surfaces thereof are covered with release films for the purpose of preventing the adhesion of, for example, dust and dirt. These release films are removed from the heat-dissipating sheet 10 when the heat-dissipating sheet 10 is mounted on an electronic substrate provided with, for example, a heat-generating body. The release films may be the same as the release films used for the production of the heat-dissipating sheet 10 or may be release films separately attached after removal of the release films used for the production.

Figure 2A:
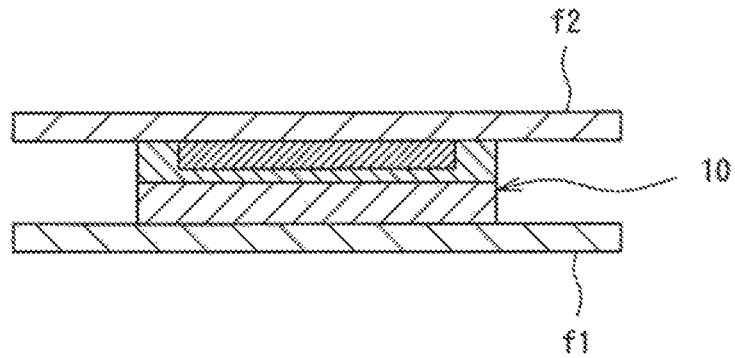
FIGS. 2a-2c illustrates a method for mounting a heat-dissipating sheet.
Figure 2B:
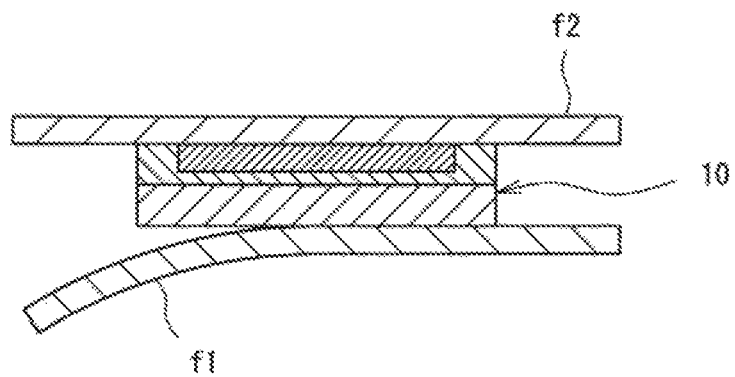
Figure 2C:
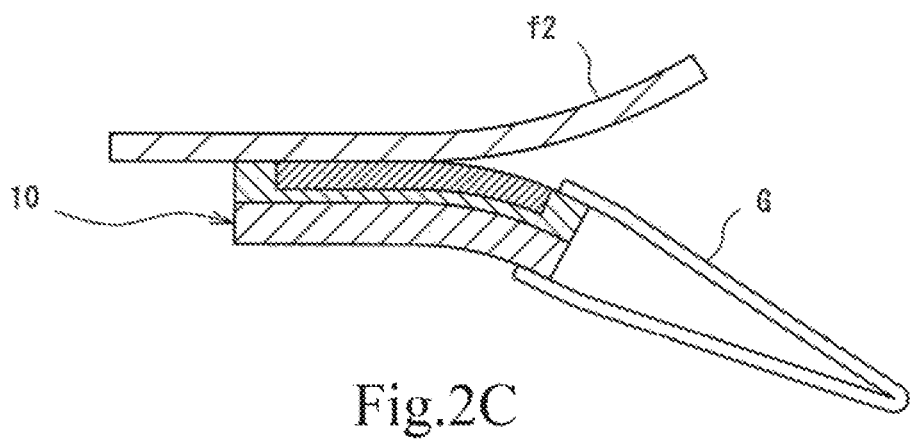
Figure 3A:
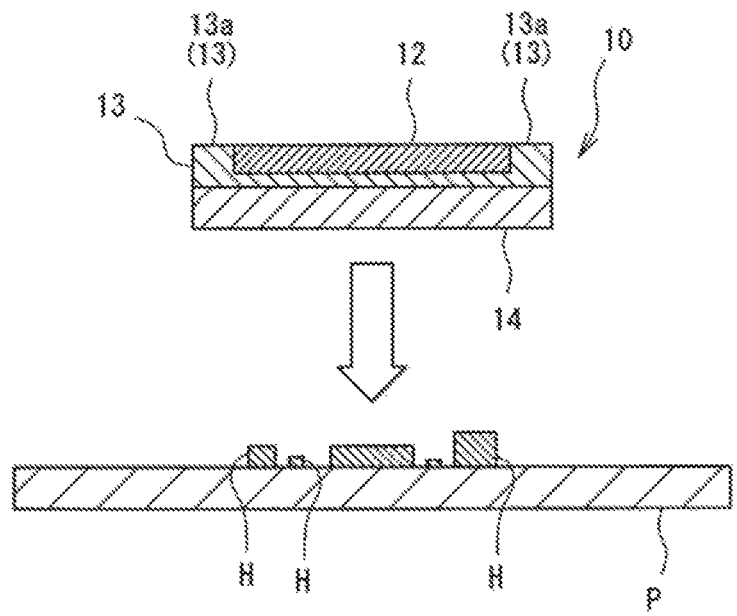
FIGS. 3a and 3b illustrates the method for mounting a heat-dissipating sheet subsequent to FIGS. 2a-2c.
Figure 3B:
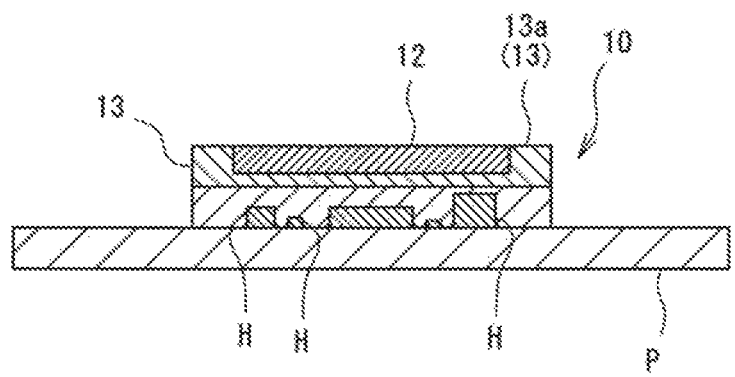

A method for mounting the heat-dissipating sheet 10 on an electronic substrate P will be described with reference to FIGS. 2 and 3. As illustrated in FIG. 2(a), the heat-dissipating sheet 10 has both front and back surfaces covered with release films f1 and f2. As illustrated in FIG. 2(b), the release film f1 adjacent to the second thermally conductive layer 14 is peeled. As illustrated in FIG. 2(c), an end portion of the heat-dissipating sheet 10 is gripped with tweezers G while the release film f2 adjacent to the graphite sheet 12 is peeled. As illustrated in FIG. 3(a), the heat-dissipating sheet 10 is disposed in such a manner that the second thermally conductive layer 14 covers heat-generating bodies H such as electronic components mounted on the electronic substrate P. As illustrated in FIG. 3(b), the heat-dissipating sheet 10 is pressed into contact with the electronic substrate P. At this time, care is taken to overlap the heat-generating bodies H with the graphite sheet 12 in the vertical direction. The pressure contact of the heat-dissipating sheet 10 is performed until the second thermally conductive layer 14 is deformed along irregularities formed by the heat-generating bodies H protruding from the electronic substrate P and comes into close contact with the heat-generating bodies H and the electronic substrate P. Then the graphite sheet 12 side of the heat-dissipating sheet 10 is brought into contact with, for example, a housing serving as a heat-dissipating body, thereby completing the mounting structure of the heat-dissipating sheet 10. The heat-dissipating sheet 10 has a good close-contact state with the adherend even if the pressure is released after the heat-dissipating sheet 10 is mounted on the adherend.

Figure 15A:
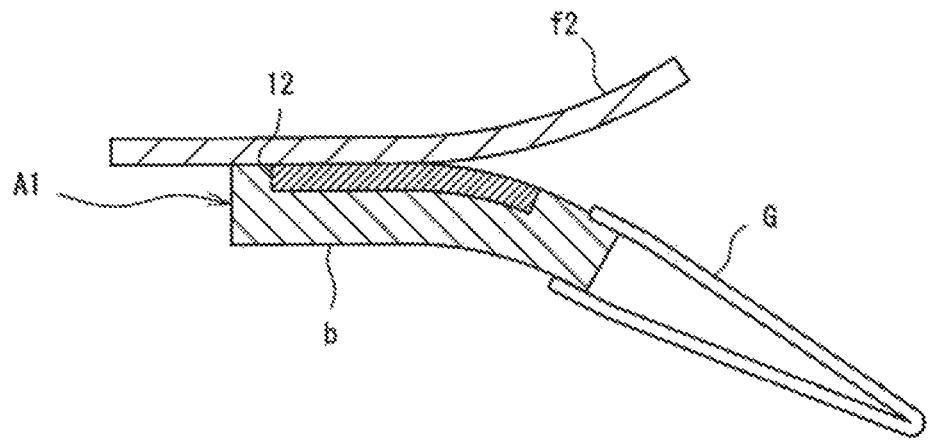
FIGS. 15a and 15b illustrates the handleability of a heat-dissipating sheet including a thermally conductive layer composed of a flexible material.
Figure 15B:
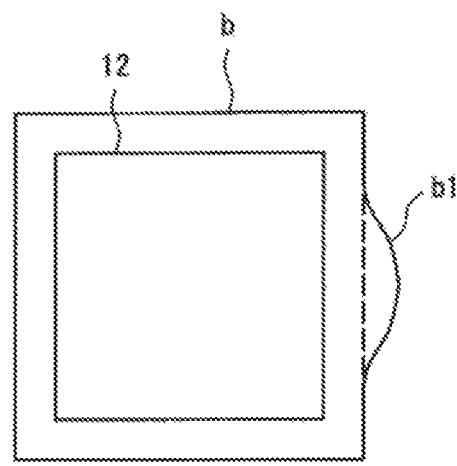

Unlike the heat-dissipating sheet 10, in the case of a heat-dissipating sheet A1 in which only a flexible thermally conductive layer b is stacked on the graphite sheet 12, when the release film f2 is peeled as illustrated in FIG. 15(a), an end portion b1 of the thermally conductive layer b may be elongated and deformed as illustrated in FIG. 15(b). In contrast, the heat-dissipating sheet 10 includes the hard first thermally conductive layer 13 and thus can be peeled from the release films f1 and f2 while an end portion of the flexible second thermally conductive layer 14 is not elongated.

Figure 14A:
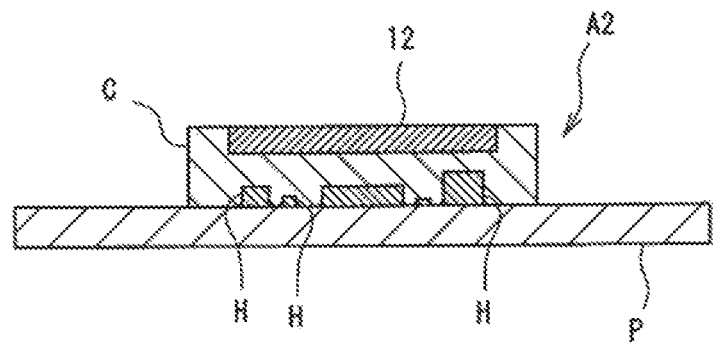
FIGS. 14a and 14b illustrates the mounted state of a heat-dissipating sheet including a thermally conductive layer composed of rubber having high impact resilience.
Figure 14B:
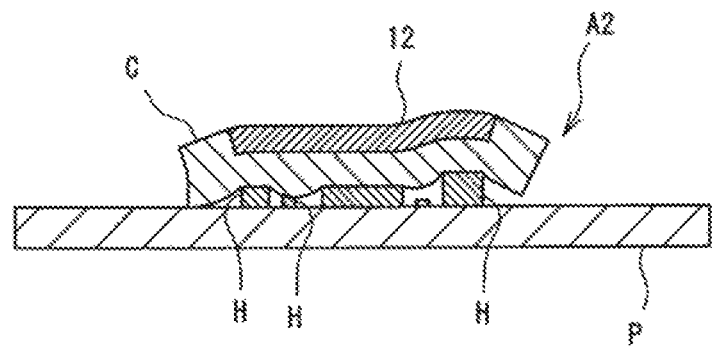

Unlike the heat-dissipating sheet 10, in the case of a heat-dissipating sheet A2 in which only a hard (high-impact-resilience) thermally conductive layer c is stacked on the graphite sheet 12, when the heat-dissipating sheet A2 is mounted on the heat-generating bodies H on the electronic substrate P, the heat-dissipating sheet A2 is in close contact with the electronic substrate P during pressure contact as illustrated in FIG. 14(a). However, as illustrated in FIG. 14(b), when the pressure is released from the state of pressure contact, the state of close contact cannot be maintained, thereby possibly forming a gap. In contrast, the heat-dissipating sheet 10 includes the flexible second thermally conductive layer 14; thus, it is possible to inhibit the formation of a gap and maintain the state of close contact.

Second Embodiment [FIG. 4]

As illustrated in FIG. 4, a heat-dissipating sheet 20 according to this embodiment differs from the heat-dissipating sheet 10 according to the first embodiment in that a first thermally conductive layer 23 has a peripheral wall portion 23b protruding to the second thermally conductive layer 24 side at its peripheral portion.

Because the peripheral wall portion 23b is disposed at the peripheral portion of the heat-dissipating sheet 20, the first thermally conductive layer 23 has an increased thickness at the peripheral portion, thereby further enhancing the shape-retaining properties of the heat-dissipating sheet 20. As is the heat-dissipating sheet 10, the second thermally conductive layer 24 is disposed at a portion superimposed on a graphite sheet 22 when viewed in plan. Thus, the heat-dissipating sheet 20 can conform to the irregularities of the heat-generating bodies H and can come into close contact therewith.

Because the peripheral wall portion 23b is disposed, the outer edge of the heat-dissipating sheet 20 can be formed of the first thermally conductive layer 23. Thus, when the heat-dissipating sheet 20 is peeled from the release films f1 and f2, the peeling starts from the interface between the first thermally conductive layer 23 and the release films f1 and f2. In this case, the peeling is smoothly triggered, thus leading to better workability.

Third Embodiment [FIGS. 5a and 5b]

As illustrated in FIGS. 5a and 5b, a heat-dissipating sheet 30 according to this embodiment differs from the heat-dissipating sheet 10 according to the first embodiment in that a protective layer 35 covering a surface of the sheet adjacent to a graphite sheet 32 is disposed.

For the protective layer 35, sheet-like rubber, resin, metal, or the like may be used. When insulating properties are required, a film of an insulating resin such as polyester, polyurethane, polyamide, polyimide, an epoxy resin, or a phenolic resin is preferably used. Among these, in particular, an inexpensive poly(ethylene terephthalate) film or a heat-resistant polyimide film is preferred. When the protective layer 35 is electrically conductive, aluminum or copper, which has a relatively high thermal conductivity and is inexpensive among metals, or stainless steel, which has good corrosion resistance, is preferred.

In a heat-dissipating sheet 30a (30) illustrated in FIG. 5(a), a protective layer 35a (35) has the same outer shape as the graphite sheet 32 when viewed in plan. Specifically, the protective layer 35a is disposed on a surface of the graphite sheet 32 and does not cover a portion of a first thermally conductive layer 33 at its outer edge. Thereby the first thermally conductive layer 33 is exposed. In the heat-dissipating sheet 30a, the thick portion 33a of the first thermally conductive layer 33 is exposed at the upper surface. Thus, a heat-dissipating body or the like to be brought into close contact with the upper surface (graphite sheet 32 side) can be brought into close contact with the upper surface using the adhesion of the first thermally conductive layer 33, which is preferred.

In a heat-dissipating sheet 30b (30) illustrated in FIG. 5(b), a protective layer 35b (35) covers the entire heat-dissipating sheet 30b when viewed in plan. That is, the protective layer 35b covers both of the graphite sheet 32 and the first thermally conductive layer 33. The heat-dissipating sheet 30b is mounted on the electronic substrate P while the protective layer 35b is disposed. In this case, for example, when the heat-dissipating sheet 30b is mounted, it can be assembled while sliding the upper surface of the heat-dissipating sheet 30b. The resulting assembly can have a structure in which the heat-dissipating sheet 30b can be moved with respect to the heat-dissipating body without fixing the upper surface of the heat-dissipating sheet 30b during the subsequent use. This is useful for applications where the heat-dissipating body may move relative to the heat-dissipating sheet 30b.

In any of the heat-dissipating sheets 30a and 30b, because the protective layer 35 is disposed, it is possible to prevent damage to the graphite sheet 32 and to prevent the detachment of a graphite powder from the graphite sheet 32.

Figure 6A:
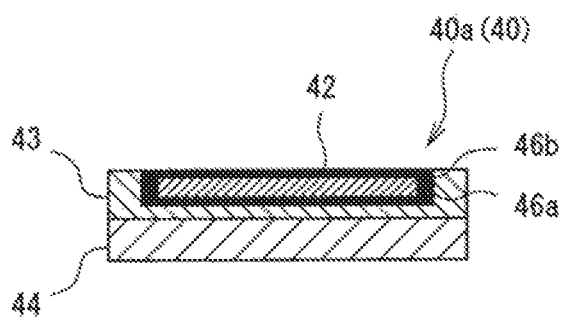
FIGS. 6a and 6b is a cross-sectional view of a heat-dissipating sheet according to a fourth embodiment, the view corresponding to FIG. 1(b)
Figure 6B:
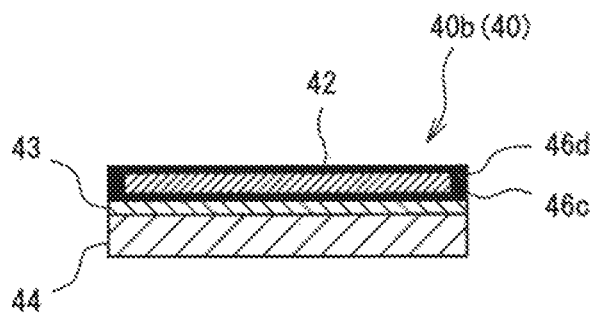

Fourth Embodiment [FIGS. 6a and 6b]

As illustrated in FIGS. 6a and 6b, a heat-dissipating sheet 40 according to this embodiment differs from the heat-dissipating sheet 30 according to the third embodiment in that a second protective layer 46a covering the lower surface of a graphite sheet 42 is disposed. The heat-dissipating sheet 40 has a structure in which a protective layer 46b is disposed on a surface of the graphite sheet 42, the second protective layer 46a is disposed on the lower surface of the graphite sheet 42, and the outer edge of the protective layer 46b and the outer edge of the second protective layer 46a are bonded to each other to cover the graphite sheet 42.

The material of the second protective layer 46a and the protective layer (first protective layer) 46b may be the same as, or different from, the material of the protective layer 35 of the heat-dissipating sheet 30. The use of the second protective layer 46a and the protective layer 46b composed of the same material is preferred in that lamination with the graphite sheet 42 is easily performed because of less warpage due to a difference in heat shrinkage.

In a heat-dissipating sheet 40a (40) illustrated in FIG. 6(a), a first thermally conductive layer 43 is exposed at the outer edge of a surface. Because the thick portion 43a of the first thermally conductive layer 43 is exposed at the upper surface, the heat-dissipating sheet 40a can be brought into close contact with a heat-dissipating body or the like using the adhesion thereof, which is preferred.

In a heat-dissipating sheet 40b (40) illustrated in FIG. 6(b), a protective layer 46d and a second protective layer 46c are stacked on the first thermally conductive layer 43 so as to have the outer shape that forms the outer shape of the heat-dissipating sheet 40b when viewed in plan. That is, the protective layer 46d covers both of the graphite sheet 42 and the first thermally conductive layer 43. The heat-dissipating sheet 40b is mounted on the electronic substrate P while the protective layer 46b is disposed. In this case, it can be assembled while sliding the upper surface of the heat-dissipating sheet 40b. The resulting assembly can have a structure in which the heat-dissipating sheet 40b can be moved with respect to the heat-dissipating body or the like without fixing the upper surface of the heat-dissipating sheet 40b during the subsequent use. This is suitable for applications where the heat-dissipating body or the like may move relative to the heat-dissipating sheet 40b.

In any of the heat-dissipating sheets 40a and 40b, because the protective layer 46b or 46d and the second protective layer 46a or 46c are disposed, it is possible to prevent damage to the graphite sheet 42 and to prevent the detachment of a graphite powder from the graphite sheet 42. Because the second protective layer 46a or 46c is disposed, in an operation before integrating with the first heat conductive layer 43, it is also possible to prevent damage to the graphite sheet 42 and to prevent the detachment of a graphite powder from the graphite sheet 42. Additionally, in the case of a low degree of close contact between the graphite sheet 42 and the first thermally conductive layer 43, the interposition of the second protective layer 46a or 46c can improve the close-contact properties of the first thermally conductive layer 43.

Although the structures in which the end portion of the graphite sheet 42 is covered with protective layer 46b or 46d and the second protective layer 46a or 46c are described in the above embodiment, the embodiment also includes a structure in which it is not covered therewith. In the heat-dissipating sheet 40, as a structure including the graphite sheet 12 and the protective layer 46b or 46d and the second protective layer 46a or 46c, a graphite sheet (laminated graphite sheet) in which both front and back surfaces of sheet-shaped graphite are laminated with protective films serving as protective layers may be used.

Figure 7A:
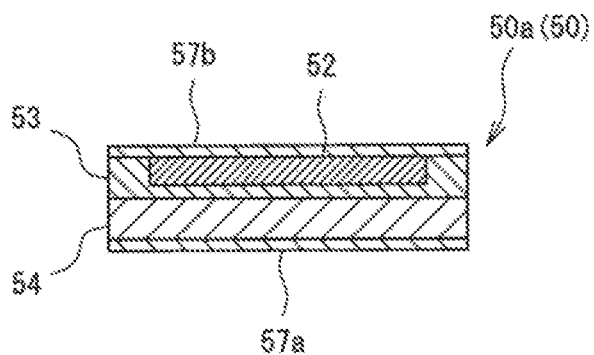
FIGS. 7a-7c is a cross-sectional view of a heat-dissipating sheet according to fifth embodiment, the view corresponding to FIG. 1(b)
Figure 7B:
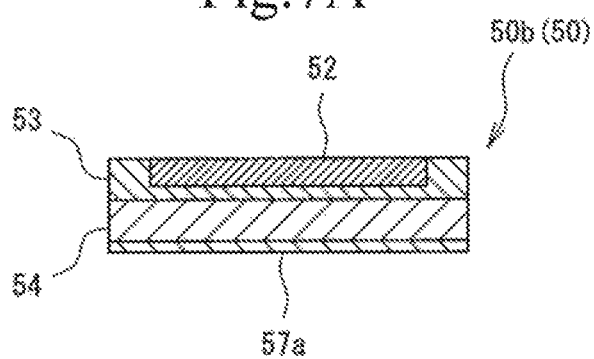
Figure 7C:
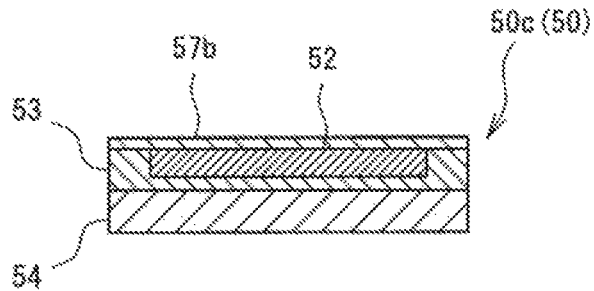

Fifth Embodiment [FIGS. 7a-7c]

As illustrated in FIGS. 7a-7c, a heat-dissipating sheet 50 according to this embodiment differs from the heat-dissipating sheet 10 according to the first embodiment in that a release layer 57 covering a surface thereof is disposed.

As the release layer 57, a resin film composed of, for example, a fluorocarbon-based resin, melamine, silicone, polyethylene, or polypropylene or a film coated with the resin may be used. Among these, in the case of using silicone as the polymer matrix of the heat-dissipating sheet 50, the fluorocarbon-based resin is preferably used.

The release film described in the method for mounting the heat-dissipating sheet 10 on the electronic substrate P or the release film used for the production of the heat-dissipating sheet 10 may be used as the release layer 57 in this embodiment.

A heat-dissipating sheet 50a (50) illustrated in FIG. 7(a) includes release layers 57a and 57b on both surfaces of the heat-dissipating sheet 50a. This structure can protect both the surfaces of the heat-dissipating sheet 50a from the adhesion of dust, dirt, and so forth and is more preferable than when a release film is disposed on any one of the surfaces of a heat-dissipating sheet.

A heat-dissipating sheet 50b (50) illustrated in FIG. 7(b) includes a release layer 57a on a surface of the heat-dissipating sheet 50b adjacent to a second thermally conductive layer 54. Because the release layer 57a is disposed on the flexible second thermally conductive layer 54 to which dust, dirt, and so forth adhere easily, it is possible to effectively prevent the adhesion of dust, dirt, and so forth. Additionally, because the second thermally conductive layer 54 is flexible and easily deformed, it is also possible to prevent unexpected deformation before mounting on the electronic substrate P.

A heat-dissipating sheet 50c (50) illustrated in FIG. 7(c) includes the release layer 57b on a surface of the heat-dissipating sheet 50c adjacent to a graphite sheet 52. Even in a heat-dissipating sheet having a structure in which the graphite sheet 52 is not protected by the protective layer 35, the graphite sheet 52 can be protected. Additionally, it is possible to prevent the adhesion of dust, dirt, and so forth to a surface of the graphite sheet 52 and to prevent a decrease in thermal conductivity due to the interposition of dust, dirt, and so forth between the graphite sheet and a heat-dissipating body.

Figure 8:
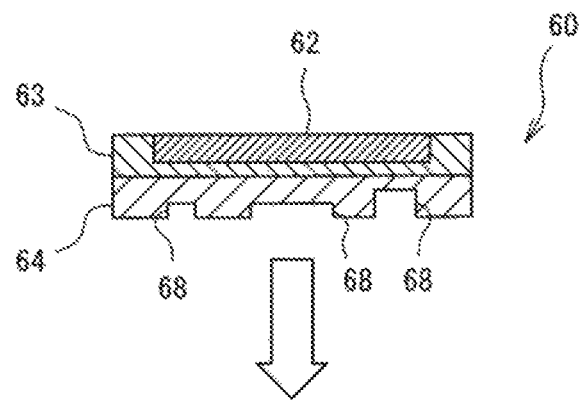
FIG. 8 is an explanatory drawing illustrating the mounted state of a heat-dissipating sheet according to a modification of each embodiment.
Figure 8:
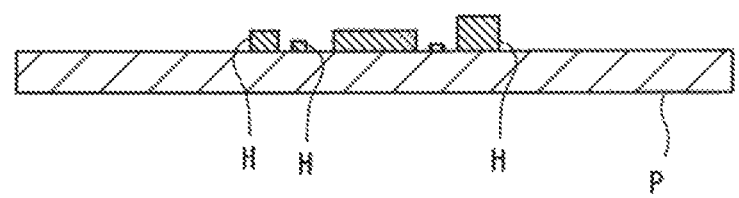

Modification of Embodiment [FIG. 8]

The heat-dissipating sheets 10, 20, 30, 40, and 50 described in the above embodiments are in the form of a flat sheet. However, they may have irregularities on their surfaces. For example, as illustrated in FIG. 8, a heat-dissipating sheet 60 may include the second thermally conductive layer 64 having recessed portions 68 conforming to the outer shape of the electronic substrate P including the heat-generating bodies H. To reliably bring the recessed portions 68 into close contact with the surfaces of the heat-generating bodies H, the depths of the recessed portions 68 are preferably shallower than the heights of the respective heat-generating bodies H.

In the heat-dissipating sheets 10, 20, 30, 50, and 60 described in the above embodiments, the first thermally conductive layers 13, 23, 33, 53, and 63 have larger outer shapes than the graphite sheets 12, 22, 32, 52, and 62, respectively. However, according to modifications of the embodiments, the first thermally conductive layers 13, 23, 33, 53, and 63 may have the same outer shape as the graphite sheets 12, 22, 32, 52, and 62, respectively. In this case, it is possible to cut a large sheet to form small heat-dissipating sheets 10, 20, 30, 50, and 60 having a freely-selected shape. Thus, the heat-dissipating sheets 10, 20, 30, 50, and 60 are easily produced at low cost.

Figure 9:
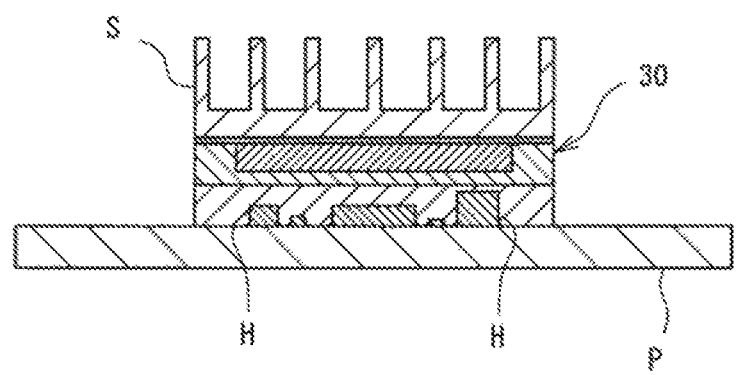
FIG. 9 is an explanatory drawing illustrating a modification of the method for mounting a heat-dissipating sheet.
Figure 10:
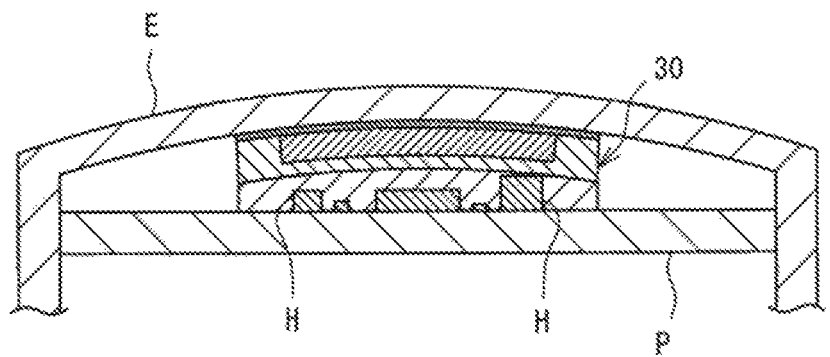
FIG. 10 is an explanatory drawing illustrating another modification of the method for mounting a heat-dissipating sheet.
Figure 11:
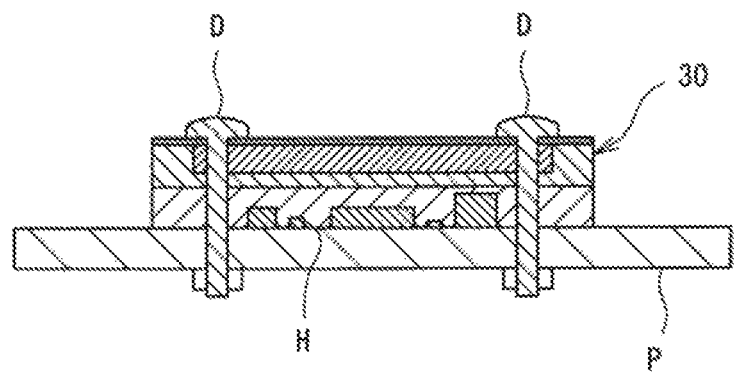
FIG. 11 is an explanatory drawing illustrating still another modification of the method for mounting a heat-dissipating sheet.

Other Modifications [FIGS. 9, 10, and 11]:

In each of the heat-dissipating sheets 10, 20, 30, and 40 described in the above embodiments, as the method for mounting the heat-dissipating sheet on the electronic substrate P, "a method in which the heat-dissipating sheet is pressed into close contact with the heat-generating bodies H at the time of mounting and then the pressure is released before use" is described. However, the following mounting and use methods may be used. Usage examples the heat-dissipating sheet 30 (30b) will be described below.

An example illustrated in FIG. 9 is a modification in which the heat-dissipating sheet 30 is pressed into contact with the heat-generating bodies H using a heat-dissipating body such as a heat sink S or a metal plate when used. The heat sink S and the heat-dissipating sheet 30 may be pressed into contact with each other without being fixed, but may be fixed with a tackiness material or an adhesive. It is preferable to use the heat-dissipating sheet 30 having a structure in which the first thermally conductive layer has the thick portion exposed at the upper surface at which the graphite sheet is exposed. In the case of using the heat-dissipating sheet 30, the heat-dissipating sheet 30 can be fixed to the heat sink S without using an adhesive or the like separately. The heat-dissipating sheet 30 that does not include the protective layer 35 is also preferred. Because the graphite sheet can be covered with the heat sink S and the first thermally conductive layer, damage to the graphite sheet can be prevented. In the case of using an adhesive or the like, a thermally conductive adhesive is preferably used. The interposition of the thermally conductive adhesive between the heat-dissipating sheet and the heat sink S enables a reduction in thermal resistance between the graphite sheet and the heat sink S, thereby enhancing the heat dissipation efficiency.

An example illustrated in FIG. 10 is a modification in which the heat-dissipating sheet 30 is pressed into contact with the heat-generating bodies H with a housing, a case E, or the like in place of the heat sink S. In a small wearable or waterproof device, it is often difficult to provide an air circulation-exhaust structure for air-cooling the heat sink S. In such a case, heat is dissipated through the electronic substrate P or through the housing, the case E, or the like. However, when the heat-generating bodies H are directly brought into close contact with the housing, the case E, or the like, heat spots may be formed to cause deformation of the housing, the case E, or the like or to cause a burn or the like. In such a case, as illustrated in FIG. 10, when the heat-dissipating sheet 30 is brought into close contact with the housing, the case E, or the like, the heat-dissipating sheet 30 can transfer heat to the housing, the case, or the like while diffusing the heat into the sheet surface thereof. Thus, the heat spots can be eliminated, and heat can be dissipated in w wide area of the housing, the case E, or the like, thereby improving the heat dissipation properties of the device.

As illustrated in FIG. 10, the shape of the housing, the case E, or the like is not limited to a flat shape and may be curved. In the heat-dissipating sheet 30, the first thermally conductive layer that improves the handleability is stacked on the flexible second thermally conductive layer. Thus, even in the case of the housing, the case E, or the like that is curved, the second thermally conductive layer absorbs a difference in the size of the gap between the electronic substrate P and the housing, the case, or the like to enable the heat-dissipating sheet 30 to be brought into close contact with the entire electronic substrate P.

An example illustrated in FIG. 11 is a modification in which the heat-dissipating sheet 30 is pressed into contact with and fixed to the heat-generating body with fixation devices D such as screws or pins. The fixation devices D are provided at positions that do not overlap the heat-generating bodies H. The heat-dissipating sheet 30 fixed by the fixation devices D desirably has a hard surface. Thus, this modification is preferably applied to the heat-dissipating sheet 30 including the hard protective layer 35.

The characteristic structures of the embodiments and the modifications may be combined as long as no problem occurs. For example, a heat-dissipating sheet may include a peripheral wall portion and a protective layer. A heat-dissipating sheet may partially include a peripheral wall portion and a protective layer.

EXAMPLES

<Production of Heat-Dissipating Sheet>

Heat-dissipating sheets of samples 1 to 9 described below were produced.

Sample 1:

A graphite sheet having an outer rectangular shape of 20×20 mm and having a thickness of 40 μm and a release film were provided. The release film used here was formed by bonding a surface of a 20×20 mm slightly tacky film ("GN75" (trade name), available from Panac Co., Ltd.) opposite to the slightly tacky surface thereof to a fluorosilicone-based film ("SS4C" (trade name), available from Nippa Co., Ltd.) with a double-sided tape ("No. 7071" (trade name), available from Teraoka Seisakusho Co., Ltd.) provided therebetween. The graphite sheet was disposed on the slightly tacky surface of the release film. A first thermally conductive layer and a second thermally conductive layer were stacked on the graphite sheet and the slightly tacky surface of the release film so as to completely cover the graphite sheet. Specifically, a first thermally conductive layer coating liquid was applied and cured to form the first thermally conductive layer. The first thermally conductive layer had a thickness of 0.16 mm at a portion stacked on the graphite sheet and a thickness of 0.2 mm at the periphery that was not stacked on the graphite sheet. A second thermally conductive layer coating liquid was applied to a surface of the first thermally conductive layer and cured to form the second thermally conductive layer. The second thermally conductive layer had a thickness of 1.8 mm. Accordingly, the overall thickness was 2 mm. Both of the thermally conductive layers were cut at a position 2.5 mm offset outward from the outer edge of the graphite sheet to obtain a heat-dissipating sheet including a heat-dissipating member having a 25×25 mm outer shape, the heat-dissipating sheet having a structure as illustrated in FIGS. 1A and 1B. This is designated as sample 1 for a handling test.

A heat-dissipating sheet including graphite with an outer shape of 8×8 mm (thickness: 40 μm) and a heat-dissipating member with an outer shape of 10×10 mm (thickness: 2 mm) was formed in the same manner as described above and cut at the center to obtain a heat-dissipating sheet of sample 1 for a test of close-contact properties.

The second thermally conductive layer coating liquid was a silicone composition in which 400 parts by mass of indefinite-shaped aluminum hydroxide having an average particle size of 10 μm was mixed with 90 parts by mass of an alkenyl group-containing organopolysiloxane and 10 parts by mass of a hydrogen organopolysiloxane. The second thermally conductive layer coating liquid was a silicone composition in which 400 parts by mass of indefinite-shaped aluminum hydroxide having an average particle size of 10 µm was mixed with 93 parts by mass of the alkenyl group-containing organopolysiloxane and 7 parts by mass of the hydrogen organopolysiloxane.

As described above, the first thermally conductive layer coating liquid and the second thermally conductive layer coating liquid were composed of the same materials. By adjusting the amount of the curing agent mixed, the first thermally conductive layer coating liquid was adjusted to have a type OO hardness of 40 after curing, and the second thermally conductive layer coating liquid was adjusted so as to have a type OO hardness of 15 after curing.

A cured product obtained by curing only 90 parts by mass of the alkenyl group-containing organopolysiloxane and 10 parts by mass of the hydrogen organopolysiloxane serving as the polymer matrix of the first thermally conductive layer coating liquid has a type OO hardness of 10 (penetration number: 110). A cured product obtained by curing only 93 parts by mass of the alkenyl group-containing organopolysiloxane and 7 parts by mass of the hydrogen organopolysiloxane serving as the polymer matrix of the second thermally conductive layer coating liquid has a type OO hardness of 0 (penetration number: 400). The percentage of the polymer matrix in each of the first thermally conductive layer coating liquid and the second thermally conductive layer coating liquid is 43% by volume. Each of the first thermally conductive layer and the second thermally conductive layer, which are cured products thereof, has a thermal conductivity of 1.4 W/m·K.

Sample 2:

A heat-dissipating sheet of sample 2 of the same shape was produced in the same manner as sample 1, except that only the first thermally conductive layer coating liquid was used in place of the first thermally conductive layer coating liquid and the second thermally conductive layer coating liquid used for sample 1.

Sample 3:

A heat-dissipating sheet of sample 3 of the same shape was produced in the same manner as sample 1, except that only the second thermally conductive layer coating liquid was used in place of the first thermally conductive layer coating liquid and the second thermally conductive layer coating liquid used for sample 1.

Samples 4 to 8:

Heat-dissipating sheets of samples 4 to 8 of the same shape were produced in the same manner as sample 1, except that first thermally conductive layer coating liquids and second thermally conductive layer coating liquids in which the percentage of the curing agent was changed without changing the materials of the first thermally conductive layer coating liquid and the second thermally conductive layer coating liquid used for sample 1 were used in such a manner that the first thermally conductive layers and the second thermally conductive layers each had a hardness presented in Table 1. A cured product obtained by curing only the polymer matrix of a thermally conductive layer having a type OO hardness of 20 after curing had a type 00 hardness of 0 (penetration number: 320). A cured product obtained by curing only the polymer matrix of a thermally conductive layer having a type OO hardness of 28 after curing had a type OO hardness of 2 (penetration number: 160). A cured product obtained by curing only the polymer matrix of a thermally conductive layer having a type OO hardness of 33 after curing had a type OO hardness of 4 (penetration number: 130).

Sample 9:

A heat-dissipating sheet of sample 9 having the same size and so forth was produced in the same manner as sample 1 with the same raw materials, except that the structure as illustrated in FIG. 4 was used in place of the heat-dissipating sheet of sample 1 having the structure as illustrated in FIGS. 1A and 1B. Differences from sample 1 in the production were as follows: After the first thermally conductive layer coating liquid was applied, a mold of size and shape of the second thermally conductive layer was disposed thereon. After the mold was pushed in the first thermally conductive layer coating liquid in such a manner that a surface of the mold was flush with the first thermally conductive layer coating liquid, the first thermally conductive layer coating liquid was cured. The second thermally conductive layer coating liquid was charged into the recessed portion of the first thermally conductive layer formed by removing the mold and then cured. The outer shape of the second thermally conductive layer was the same as that of the graphite sheet.

TABLE 1

|  | Sample 1 | Sample 2 | Sample 3 | Sample 4 | Sample 5 | Sample 6 | Sample 7 | Sample 8 | Sample 9 |
| --- | --- | --- | --- | --- | --- | --- | --- | --- | --- |
| First thermally conductive layer (OO hardness) | 40 | 40 | 15 | 15 | 33 | 33 | 33 | 20 | 40 |
| Second thermally conductive layer (OO hardness) | 15 | 40 | 15 | 40 | 5 | 20 | 28 | 20 | 15 |
| Handleability | ⊙ | ⊙ | X | ⊙ | ○ | ○ | ⊙ | X | ⊙ |
| Rate of change in area | 0.9 | 0.3 | 7 | 0.4 | 1.3 | 1.1 | 0.8 | 4.2 | 0.4 |
| Close-contact property | ○ | X | ⊙ | X | ⊙ | ○ | ○ | ○ | ○ |
| Peeling width T1 (mm) | 0.27 | 1.58 | 0.39 | 1.85 | 0.26 | 0.45 | 0.69 | 0.52 | 0.28 |
| Peeling width T2 (mm) | 0.61 | 3.41 | 0.49 | 2.8 | 0.5 | 0.7 | 1.24 | 0.81 | 0.56 |

Figure 12:
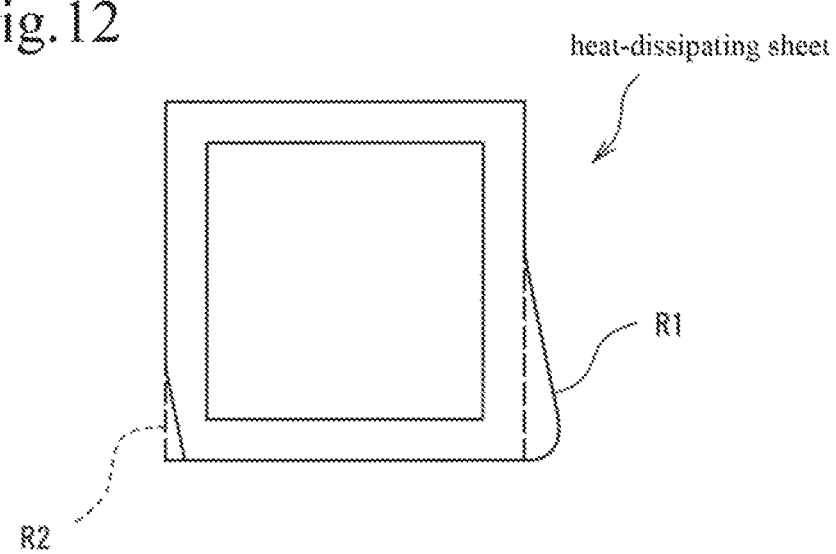
FIG. 12 is an explanatory drawing illustrating the state in which the outer edge of a thermally conductive layer of a heat-dissipating sheet protrudes.

<Regarding Handling Test of Heat-Dissipating Sheet>
Handling Test Method:

The size of the deformation of the heat-dissipating sheet when the release film was peeled from the heat-dissipating sheet was evaluated. Specifically, the first thermally conductive layer and the second thermally conductive layer serving as corner end portions were held with a flat tweezers having a tip width of 6 mm and pulled at a rate of about 10 mm/s in the direction of 120° with respect to the release film, thereby peeling the heat-dissipating member from the release film. The heat-dissipating member was placed on a flat backing sheet. The degree of deformation to the outer shape before peeling off the release film was observed. Specifically, for example, assuming that deformation occurred as illustrated in FIG. 12, letting the area of a portion protruding to the outside be R1 and letting the area of a portion eliminated from the initial shape be R2, the absolute values of the areas were added, and a percentage (called a deformation percentage) with respect to the initial shape (area: S0) was calculated. A sample having a deformation percentage of 1% or less was evaluated as "⊙". A sample having a deformation percentage of more than 1% and 3% or less was evaluated as "○". A sample having a deformation percentage of more than 3% was evaluated as "x".

$$\text{Deformation percentage} = (|R1| + |R2|)/S0 \quad \text{(formula 1)}$$

Evaluation Result of Handleability:

Table 1 presents the evaluation results of the handleability of samples 1 to 9. Samples in which one or both of the first thermally conductive layer and the second thermally conductive layer have a type OO hardness of 40 or more were evaluated as "⊙". Samples in which one or both of the first thermally conductive layer and the second thermally conductive layer have a type OO hardness of 33 or more were evaluated as "○" or more. These results indicated that a heat-dissipating sheet having good handleability can be obtained by providing a thermally conductive layer having a type OO hardness of at least 33 or more as the first thermally conductive layer or the second thermally conductive layer.

<Regarding Close-Contact Property of Heat-Dissipating Sheet>
Method for Testing Close-Contact Property:

A problem regarding the state of close contact between a heat-dissipating sheet and an electronic substrate having irregularities on a surface on which electronic components are disposed is whether a thermally conductive layer returns to its initial shape and is detached from the electronic substrate or the thermally conductive layer is attached as it is when a heat-dissipating member is pressed into contact with the electronic substrate and then the pressure is released. Accordingly, the following test was performed to evaluate the close-contact properties.

An electronic substrate including an IC fixed thereon was provided, the IC having a substantially rectangular parallelepiped shape and having a length of 3.3 mm, a width of 1.5 mm, and a height of 0.5 mm. The electronic substrate had a surface covered with a resist. The IC was made of an epoxy resin. A heat-dissipating sheet (outer dimensions: 10 mm×5 mm, thickness: 2 mm) of each sample for the foregoing test was provided.

Figure 13A:
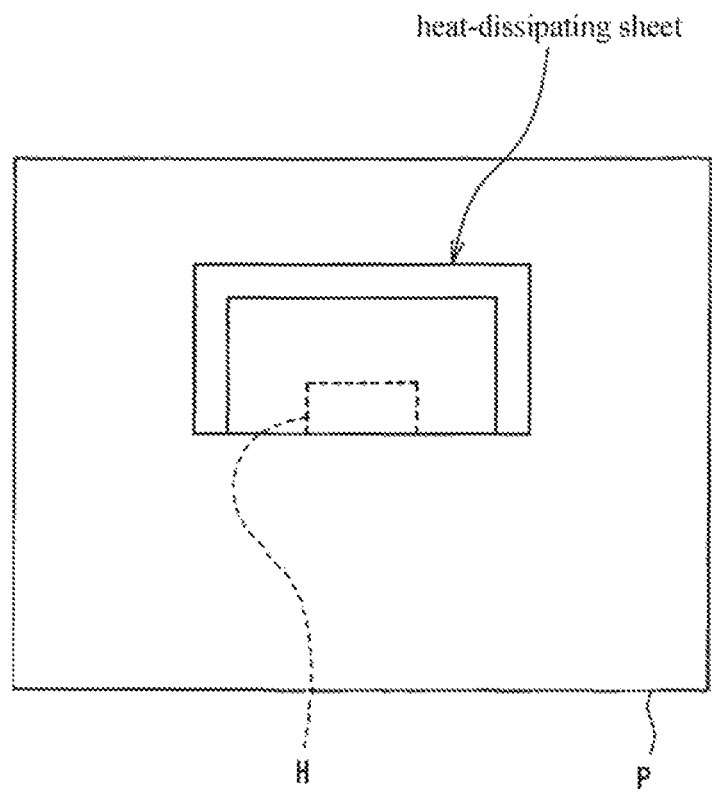
FIGS. 13a and 13b illustrates a method for testing the close-contact properties of a heat-dissipating sheet with an electronic substrate.
Figure 13B:
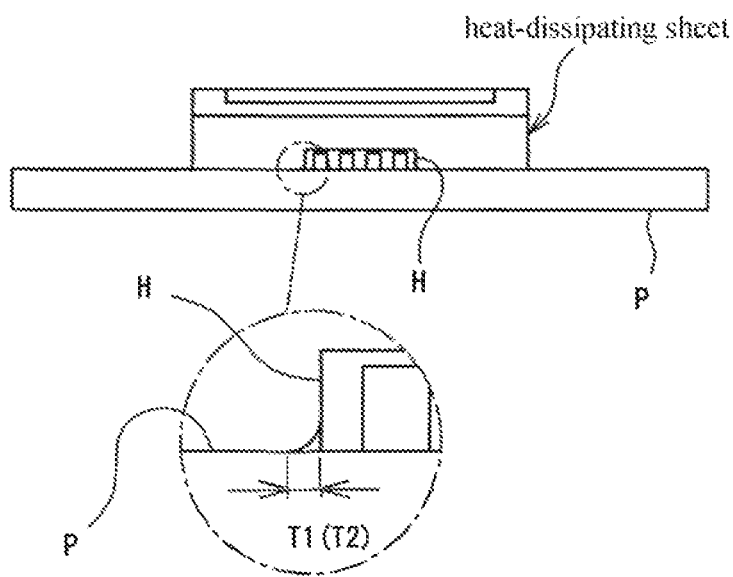

As illustrated in FIGS. 13(a) and 13(b), a side of the heat-dissipating sheet was disposed so as to be flush with the 3.3-mm side of the IC. Pressure contact was performed until a thickness of 1.6 mm was achieved. This pressure contact state was maintained for 10 seconds. The state of close contact after 5 minutes of release was observed. The peeling width T1 illustrated in FIG. 13(b) was measured. The same test was performed on each sample using a heat-dissipating sheet in which a protective layer formed of a poly(ethylene terephthalate) film having a thickness of 100 μm was stacked on the entirety of a surface adjacent to a graphite sheet. The peeling width T2 was measured. A sample having a peeling width of 0.5 mm or less was evaluated as "⊙". A sample having a peeling width of more than 0.5 mm and 1.5 mm or less was evaluated as "○". A sample having a peeling width of more than 1.5 mm was evaluated as "x".

Evaluation Results of Close-Contact Property:

Table 1 presents the evaluation results of the close-contact properties of samples 1 to 9. A lower hardness of the second thermally conductive layer resulted in better close-contact properties. The samples each having a type 00 hardness of 28 or less exhibited good results. It was found that when the second thermally conductive layer had a type OO hardness of 40, the peeling width was significantly large, thereby resulting in a low degree of close contact. The results indicated that when the second thermally conductive layer had a type OO hardness of at least 28 or less, the heat-dissipating sheet having good close-contact properties was obtained.

<Regarding Adhesive Strength of Heat-Dissipating Sheet>
Adhesive Strength Test and Result:

Measurements were made of the adhesive strength of a surface of each sample opposite to the surface adjacent to the graphite sheet. More specifically, after a contactor including a contact portion having a flat planar shape with an outside diameter of 20 mm and having a chromium-plated surface was pressed into contact with the surface of each sample opposite to the graphite sheet at a load of 3 N/cm² for 10 seconds, measurements were made of the load when the contactor was pulled vertically upward at a rate of 5 mm/min. The results indicated that each of samples 1 to 9 had an adhesive strength of 0.8 to 1.2 N/cm².

REFERENCE SIGNS LIST 10 heat-dissipating sheet (first embodiment)
11 heat-dissipating member
12 graphite sheet
13 first thermally conductive layer
13a thick portion
14 second thermally conductive layer
20 heat-dissipating sheet (second embodiment)
21 heat-dissipating member
22 graphite sheet
23 first thermally conductive layer
23a thick portion
23b peripheral wall portion
24 second thermally conductive layer
30, 30a, 30b heat-dissipating sheet (third embodiment)
31 heat-dissipating member
32 graphite sheet
33 first thermally conductive layer
33a thick portion
34 second thermally conductive layer
35, 35a, 35b protective layer
40, 40a, 40b heat-dissipating sheet (fourth embodiment)
41 heat-dissipating member
42 graphite sheet
43 first thermally conductive layer
43a thick portion
44 second thermally conductive layer
46a, 46c second protective layer 46b, 46d protective layer (first protective layer)
50, 50a, 50b heat-dissipating sheet (fifth embodiment)
51 heat-dissipating member
52 graphite sheet
53 first thermally conductive layer
54 second thermally conductive layer
57, 57a, 57b release layer
60 heat-dissipating sheet (modification)
61 heat-dissipating member
62 graphite sheet
63 first thermally conductive layer
64 second thermally conductive layer
68 recessed portion
A1, A2 heat-dissipating sheet
b (flexible) thermally conductive layer
b1 end portion
c (hard) thermally conductive layer
D fixation device
E housing, case
f1, f2 release film
G tweezers
H heat-generating body (electronic component)
P electronic substrate
R1, R2 area
S heat sink (heat-dissipating body)
T1, T2 peeling width

The invention claimed is:

1. A heat-dissipating sheet, comprising a heat-dissipating member including a graphite sheet, a first thermally conductive layer, and a second thermally conductive layer stacked in this order,
wherein the first thermally conductive layer contains a thermally conductive filler dispersed in a polymer matrix, and
the second thermally conductive layer contains a thermally conductive filler dispersed in a curing-type polymer matrix, is more flexible than the first thermally conductive layer, and has an outer shape identical to or smaller than the first thermally conductive layer when viewed in plan.

2. The heat-dissipating sheet according to claim 1, wherein the first thermally conductive layer has an outer shape larger than the graphite sheet when viewed in plan.

3. The heat-dissipating sheet according to claim 2, wherein the first thermally conductive layer has a type OO hardness of more than 30, and the second thermally conductive layer has a type OO hardness of 30 or less.

4. The heat-dissipating sheet according to claim 1, wherein the second thermally conductive layer has a polymer matrix content of 50% or less by mass, and the polymer matrix alone has a type OO hardness of 3 or less.

5. The heat-dissipating sheet according to claim 2, wherein the first thermally conductive layer includes an outer portion that protrudes from an outer shape of the graphite sheet and an inner portion that does not protrude from the outer shape of the graphite sheet when viewed in plan, the outer portion being thicker than the inner portion.

6. The heat-dissipating sheet according to claim 1, wherein the second thermally conductive layer has lower resilience than the first thermally conductive layer.

7. The heat-dissipating sheet according to claim 1, further comprising a protective layer disposed on a surface of the heat-dissipating sheet adjacent to the graphite sheet, the protective layer covering the graphite sheet.

8. The heat-dissipating sheet according to claim 1, further comprising a release layer disposed on at least one of a surface of the heat-dissipating sheet adjacent to the graphite sheet and a surface opposite to the surface.

9. The heat-dissipating sheet according to claim 1, wherein the content of the thermally conductive filler in the first thermally conductive layer is higher than the thermally conductive filler in the second thermally conductive layer, and the first thermally conductive layer has a higher thermal conductivity than the second thermally conductive layer.

10. The heat-dissipating sheet according to claim 1, wherein the second thermally conductive layer has a higher thermal conductivity than the first thermally conductive layer.

11. The heat-dissipating sheet according to claim 1, wherein the graphite sheet is a laminated graphite sheet in which both front and back surfaces of sheet-shaped graphite are laminated with protective films.

12. The heat-dissipating sheet according to claim 1, wherein the polymer matrix of the second thermally conductive layer is a cured product of an addition reaction-type silicone rubber.

* * * * *